United States Patent
Lee et al.

(10) Patent No.: US 10,037,290 B1
(45) Date of Patent: Jul. 31, 2018

(54) DUAL-PORT MEMORIES AND INPUT/OUTPUT CIRCUITS FOR PREVENTING FAILURES CORRESPONDING TO CONCURRENT ACCESSES OF DUAL-PORT MEMORY CELLS

(71) Applicant: Marvell International Ltd., Hamilton (BM)

(72) Inventors: Peter Lee, Pleasanton, CA (US); Moon-Hae Son, San Jose, CA (US); Xinghui Guo, Alhambra, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/611,332

(22) Filed: Jun. 1, 2017

Related U.S. Application Data

(60) Provisional application No. 62/344,601, filed on Jun. 2, 2016.

(51) Int. Cl.
| | |
|---|---|
| *G11C 11/406* | (2006.01) |
| *G06F 13/16* | (2006.01) |
| *G11C 7/10* | (2006.01) |
| *G06F 15/167* | (2006.01) |
| *G06F 11/16* | (2006.01) |
| *G11C 8/16* | (2006.01) |

(52) U.S. Cl.
CPC ...... *G06F 13/1663* (2013.01); *G06F 11/1658* (2013.01); *G06F 15/167* (2013.01); *G11C 7/1075* (2013.01); *G11C 8/16* (2013.01); *G11C 11/406* (2013.01)

(58) Field of Classification Search
CPC .......................... G11C 11/406; G11C 11/416
USPC ............................................ 365/154, 230.09
See application file for complete search history.

(56) References Cited

U.S. PATENT DOCUMENTS

| | | | | |
|---|---|---|---|---|
| 4,604,749 A | * | 8/1986 | Shinoda | G06F 11/1008 714/49 |
| 7,254,088 B2 | * | 8/2007 | Kurumada | G11C 8/16 365/191 |
| 7,440,316 B1 | * | 10/2008 | Lee | G11C 8/08 365/148 |

(Continued)

OTHER PUBLICATIONS 802.16-2009 IEEE Standard for Local and Metropolitan area networks; Part 16: Air Interface for Broadband Wireless Access Systems; IEEE Computer Society and the IEEE Microwave Theory and Techniques Society; Sponsored by the LAN/MAN Standard Committee; May 29, 2009; 2082 pages.

(Continued)

*Primary Examiner* — Michael Tran

(57) ABSTRACT

A dual-port memory including a first memory array and at least one address decoder. The first memory array includes memory cells and two ports for each of the memory cells. The at least one address decoder generates word line signals for concurrent access to two ports of one or more cells of the memory cells in a same row of the first memory array. Each of the word line signals is generated to perform a read operation. Pulse widths of the word line signals for the read operations are proportional to a ratio of (i) a reference amount of cell current of a cell of a reference memory array to (ii) an amount of cell current of the one or more cells of the plurality of memory cells in a same row of the first memory array.

30 Claims, 7 Drawing Sheets

(56) References Cited

U.S. PATENT DOCUMENTS

| | | | | |
|---|---|---|---|---|
| 8,908,418 B2* | 12/2014 | Yabuuchi | ............... | G11C 11/419 365/154 |
| 9,606,742 B1* | 3/2017 | Cho | ............ | G06F 1/14 |
| 2005/0047256 A1 | 3/2005 | Yang | | |
| 2005/0232050 A1* | 10/2005 | Takahashi | ............ | G11C 11/406 365/222 |
| 2007/0076503 A1 | 4/2007 | Rosen | | |
| 2008/0106953 A1 | 5/2008 | Madurawe | | |
| 2008/0310246 A1* | 12/2008 | Joshi | ............... | G11C 11/413 365/230.06 |
| 2009/0294861 A1 | 12/2009 | Thomas et al. | | |
| 2010/0214857 A1* | 8/2010 | Hsu | .............. | G11C 7/1042 365/191 |
| 2010/0329044 A1* | 12/2010 | Yeung | .............. | G11C 8/16 365/189.16 |
| 2013/0170275 A1 | 7/2013 | Kumar et al. | | |
| 2014/0009197 A1* | 1/2014 | Yasuda | ............ | H03K 3/017 327/175 |
| 2014/0032871 A1* | 1/2014 | Hsu | .............. | G11C 11/419 711/167 |
| 2014/0036608 A1* | 2/2014 | Chiu | .............. | G11C 7/227 365/194 |
| 2014/0043889 A1* | 2/2014 | Ji | ............. | G11C 11/419 365/154 |
| 2014/0119130 A1* | 5/2014 | Trivedi | .............. | G11C 7/08 365/189.02 |
| 2015/0092476 A1 | 4/2015 | Lin et al. | | |
| 2015/0340073 A1* | 11/2015 | Seo | ............. | G11C 7/222 365/189.09 |
| 2015/0348598 A1* | 12/2015 | Wang | .............. | G11C 11/417 365/72 |
| 2016/0276005 A1* | 9/2016 | Jung | ............. | G11C 8/08 |

OTHER PUBLICATIONS

IEEE Std 802.20-2008; IEEE Standard for Local and metropolitan area networks; Part 20: Air Interface for Mobile Broadband Wireless Access Systems Supporting Vehicular Mobility-Physical and Media Access Control Layer Specification; IEEE Computer Society; Sponsored by the LAN/MAN Standards Committee; Aug. 29, 2008; 1032 pages.

"Specification of the Bluetooth System" Master Table of Contents & Compliance Requirements—Covered Core Package version: 4.0; Jun. 30, 2010; 2302 pages.

"High Speed 1K X 8 Dual-Port Static SRAM"; Integrated Device Technology, Inc.; May 2016; 1 page.

"High-Speed 64/32K x 8 Synchronous Dual-Port Static RAM"; Integrated Device Technology, Inc.; Feb. 2016; 1 page.

IEEE P802.11ai/D11.0; Draft Standard for Information technololgy—Telecommunications and information exchange between systems Local and metropolitan area networks—Specific requirements; Part 11: Wireless LAN Medium Access Control (MAC) and Physical Layer (PHY) Specifications; Amendment to IEEE P802.11-REVmc/D8.0: Fast Initial Link Setup; Prepared by the 802.11 Working Group of the LAN/MAN Standards Committee of the IEEE Computer Society; Sep. 2016; 182 pages.

802.11-2016 (Revision of IEEE Std 802.11-2012) IEEE Standard for information technology—Telecommunications and information exchange between systems Local and metropolitan area networks—Specific requirements; Part 11: Wireless LAN Medium Access Control (MAC) and Physical Layer (PHY) Specifications; IEEE Computer Society; Sponsored by the LAN/MAN Standards Committee; Dec. 7, 2016; 3534 pages.

IEEE P802.11ah/D10.0; Aug. 2016; Draft Standard for Information technology—Telecommunications and information exchange between systems Local and metropolitan area networks—Specific requirements; Part 11: Wireless LAN Medium Access Control (MAC) and Physical Layer (PHY) Specifications; Amendment 2: Sub 1 GHz License Exempt Operation; LAN/MAN Standards Committee of the IEEE Computer Society; 660 pages.

* cited by examiner

DUAL-PORT MEMORIES AND INPUT/OUTPUT CIRCUITS FOR PREVENTING FAILURES CORRESPONDING TO CONCURRENT ACCESSES OF DUAL-PORT MEMORY CELLS

CROSS-REFERENCE TO RELATED APPLICATIONS

This application claims the benefit of U.S. Provisional Application No. 62/344,601, filed on Jun. 2, 2016. The entire disclosure of the application referenced above is incorporated herein by reference.

FIELD

The present disclosure relates to accessing dual-port memory, and more particularly to failures that occur during concurrent accesses of dual-port memory.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Single port memory and dual-port memory provide respectively single port or dual-port access to each cell of a corresponding memory array. Example types of these memories include register file single port (RF1P) memory, static random-access memory (SRAM) single port (SR1P) memory, register file dual-port (RF2P) memory, and SRAM dual-port (SR2P) memory. SR2P memory is most vulnerable to port-to-port interactions, which can cause intermittent failures. Intermittent failures lead to quality issues and an increased number of defective parts per million (DPPM) and as a result customer return issues.

SUMMARY

A dual-port memory is provided and includes a first memory array and at least one address decoder. The first memory array includes memory cells and two ports for each of the memory cells. The at least one address decoder generates word line signals for concurrent access to two ports of one or more cells of the memory cells in a same row of the first memory array. Each of the word line signals is generated to perform a read operation. Pulse widths of the word line signals for the read operations are proportional to a ratio of (i) a reference amount of cell current of a cell of a reference memory array to (ii) an amount of cell current of the one or more cells of the plurality of memory cells in a same row of the first memory array.

In other features, a dual-port memory is provided and includes a first memory array, at least one address decoder, and a control circuit. The first memory array includes cells. The cells include a first cell and a second cell. The first cell and the second cell are in a same row of the memory array. The at least one address decoder generates (i) a first word line signal to access a first port of the first cell, and (ii) a second word line signal to access a second port of the first cell or a port of the second cell. The control circuit permits the at least one address decoder to concurrently access the first port of a first cell and either the second port of the first cell or the port of a second cell while preventing the at least one address decoder from writing to the first port of a first cell while writing to either the second port of the first cell or the port of a second cell.

In other features, a Mux circuit for a dual-port memory is provided. The Mux circuit includes a first transistor, a second transistor, a third transistor and a first group of transistors. The first transistor is connected to a first bit line of a first cell of the dual-port memory. The second transistor is stacked on the first transistor and connected to a voltage supply reference terminal. The second transistor is to receive a write signal. The third transistor receives a column select signal and a data signal. The data signal include a bit to be written to the first cell of the dual-port memory. The first group of transistors is connected to the first transistor and the third transistor. When the column select signal is deactivated, the first transistor and the second transistor are activated to pre-charge the first bit line. During a write operation, the write signal activates the second transistor and the column select signal activates the third transistor to write the bit to the first cell via the first bit line.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF DRAWINGS

In the drawings, reference numbers may be reused to identify similar and/or identical elements.

DESCRIPTION

Figure 1:
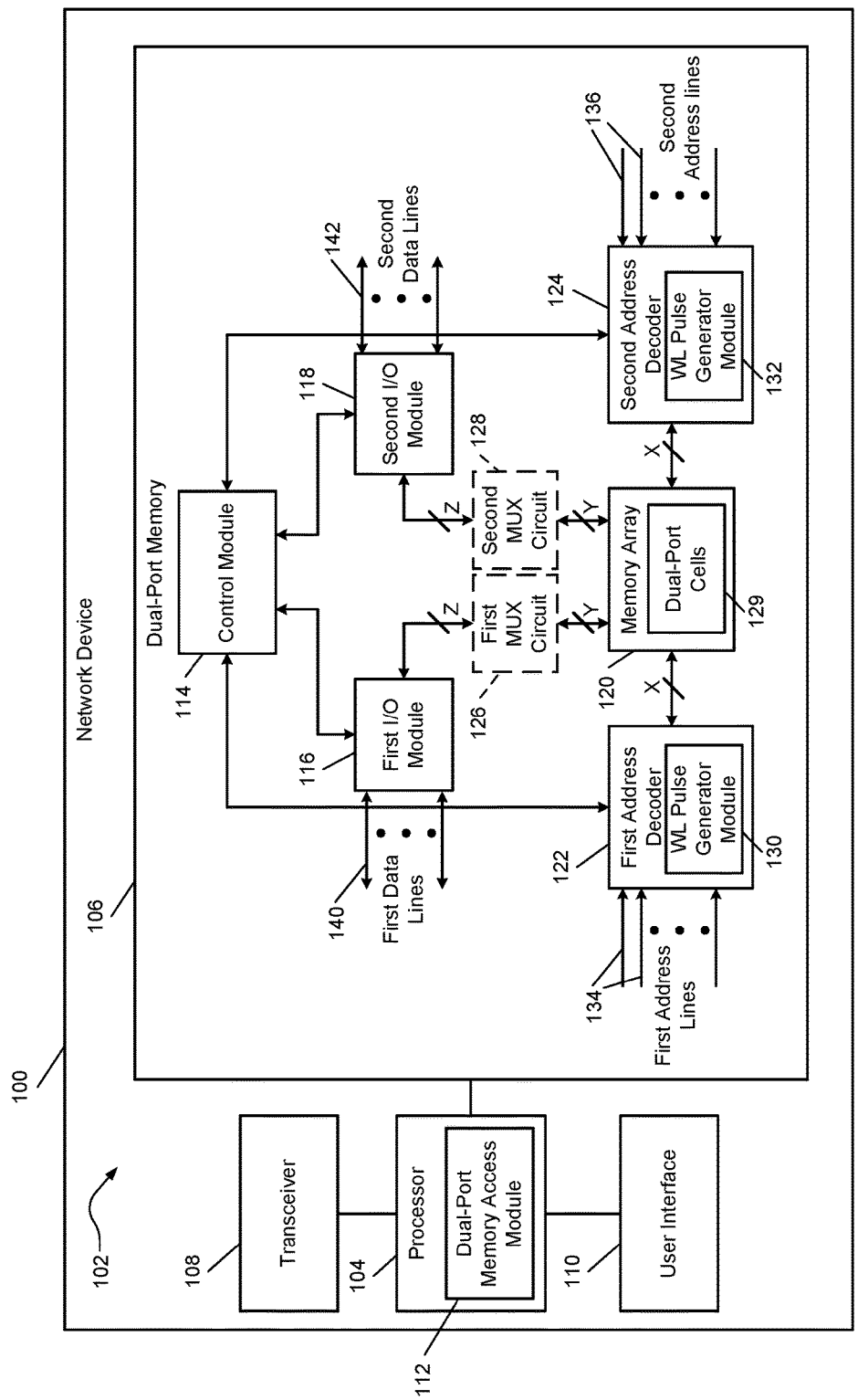
FIG. 1 is a functional block diagram view of an example of a network device including a dual-port memory system having a dual-port memory in accordance with an embodiment of the present disclosure.

SR2P memory is more vulnerable to port-to-port interactions than SR1P, RF1P, and RF2P memories because SR2P memory is more complex than SR1P, RF1P, and RF2P memories and allows a first port of a cell to be performing a first access event (e.g., a first read or a write event) while a second port of the same or different cell of a same row is performing a second access event (e.g., a second read car write event). SR1P and RF1P memories do not exhibit concurrent access issues, since each cell of the SR1P and RF1P memories has only a single port. RF2P memory has a dedicated read port and a dedicated write port for each cell and thus does not perform concurrent reading at both ports of a cell or concurrent writing at both ports of a cell. Although RF2P memory allows for concurrent read and write of the dedicated ports of a cell, the issues associated with this concurrent read/write event can be addressed by adjusting manufacturing process characteristics of transistors (e.g., threshold voltage implant dosages of the transistors) of the RF2P memory and minor timing margin adjustments for concurrent read and write events.

SR2P memory is capable of performing, for each cell of the SR2P memory, concurrent read/write, write/read, read/read, and write/write events. In addition, since the two ports of each of the cells may operate asynchronously relative to each other, testing SR2P memories during manufacturing is difficult. This is because the worst case concurrent activity may depend on a certain clock (CLK) skew between the two ports and testing for every CLK skew is costly to perform during manufacturing.

The examples disclosed herein provide circuits to eliminate or substantially reduce sources of risk related to concurrent accesses of SR2P memory. Each of the circuits may eliminate or substantially reduce the risk of one or more potential issues associated with concurrent accesses. The circuits and corresponding operations may be implemented and/or performed separately or together to provide an overall comprehensive solution. The circuits eliminate or substantially reduce occurrence of a disturb failure, which can occur when both ports of a cell are ON (or accessed). Example failures are when: both ports are concurrently performing a read event causing a read failure; a read event of a first port causes a write failure for a second port; a write event of a first port causes a read failure on a second port (referred to as an undetermined state); and a write event on a first port causes a write failure on a second port. A failure refers to when a read event provides an incorrect value (e.g., a '0' instead of a '1') or a write event stores an incorrect value (e.g., a '1' instead of a '0'). The failures can occur when concurrently accessing ports of a same cell or ports of cells in a same row of a memory array. Occurrences of concurrent accesses and/or timing of concurrent accesses may be unknown. The disclosed circuits prevent failures independent of when concurrent access events occur.

FIG. 1 shows a network device 100 that includes a dual-port memory system 102. The dual-port memory system 102 includes a processor 104, a dual-port memory 106, a transceiver 108, and a user interface 110. The processor 104 includes a dual-port memory access module 112 that access the dual-port memory 106. The dual-port memory 106 includes a control module 114, I/O module 116, 118, a memory array 120 and address decoders 122, 124. The dual-port memory 106 may also include multiplexer circuits 126, 128, which may each include multiple multiplexers.

Figure 2:
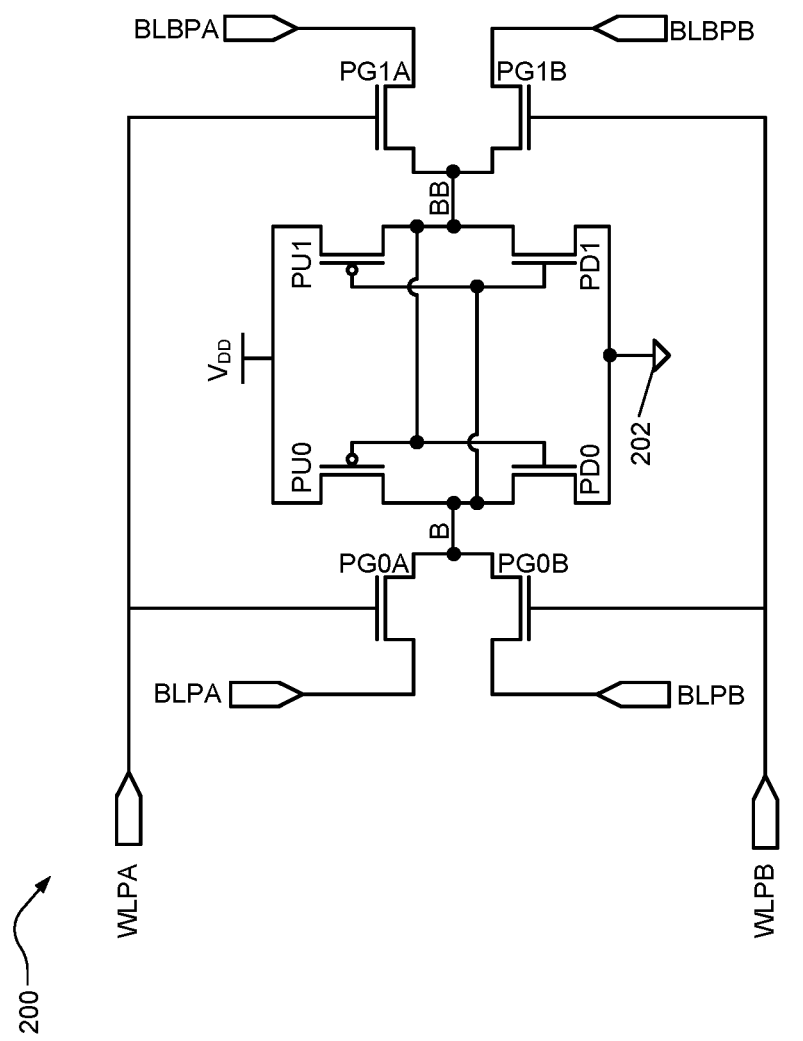
FIG. 2 is a schematic view of an example of a dual-port cell of the dual-port memory of FIG. 1.

The memory array 120 includes dual-port cells 129, which may be arranged in rows and columns. In one embodiment, the dual-port cells 129 are SRAM cells. An example of a SRAM cell is shown in FIG. 2. In another embodiment, each of the dual-port cells 129 is configured as the SRAM cell of FIG. 2. The address decoders 122, 124 may include word line pulse generator modules 130, 132, which generate word line signals to activate ports of the dual-port cells 129. The word line signals are generated based on address signals received from the dual-port memory access module 112 via address lines 134, 136.

The first port (referred to as port A) of each of the dual-port cells 129 may have a corresponding I/O circuit in the first I/O module 116 and is associated with the first address decoder 122. In one embodiment, the first ports of the dual-port cells 129 are associated with the first multiplexer circuit 126. The second port (referred to as port B) of each of the dual-port cells 129 may have a corresponding I/O circuit in the second I/O module 118 and is associated with the second address decoder 124. In an embodiment, the second ports of the dual-port cells 129 are associated with the second multiplexer circuit 128.

The control module 114 generates first control signals that are provided to the I/O modules 116, 118 and the address decoders 122, 124. The first control signals may be generated based on second control signals received from the dual-port memory access module 112. The I/O modules 116, 118 write to or read from bit lines of the dual-port cells 129. Data to be written to or read from the dual-port cells 129 is transferred between the I/O modules 116, 118 and the dual-port memory access module 112 via data lines 140, 142. The I/O modules 116, 118 may include sense amplifiers for reading data from the dual-port cells 129 and write circuits for writing data to the dual-port cells 129.

The multiplexer circuits 126, 128 may be included if the dual-port memory 106 is a MUX-2, MUX-4, MUX-8 . . . type memory. A MUX-1 type memory includes an I/O circuit in an I/O module for each port of a dual-port cell. A MUX-2 type memory includes a same I/O circuit in an I/O module for two ports respectively of two cells of a same row, but two different columns. A MUX-4 type memory includes a same I/O circuit in an I/O module for four ports respectively of four cells of a same row, but four different columns. The above-stated failures can occur when concurrently accessing ports of cells in a same row of a memory array via a multiplexer.

FIG. 1 shows variables X, Y, Z, which refer to the number of lines: between the address decoders 122, 124 and the memory array 120; between the memory array 120 and the multiplexer circuits 126, 128; and between the multiplexer circuits 126, 128 and the I/O modules 116, 118, where X, Y, and Z are integers greater than or equal to 2. The bit lines of the memory array 120 may be directly connected to the I/O modules 116, 118 if the multiplexer circuits 126, 128 are not included.

The transceiver 108 may be configured to communicate wirelessly or via wired connections to other network devices within a network. The transceiver 108 may include one or more of each of an antenna, a physical layer (PHY) module and a medium access control (MAC) module. The user interface 110 may include a touchscreen, a display, a touch pad, a mouse, an audio system including a microphone, and/or other user interface.

FIG. 2 shows a dual-port cell 200 of the memory array 120 of FIG. 1. The dual-port cell 200 includes two word line ports WLPA, WLPB and two sets of bit line ports (or pins) BLPA, BLBPA and BLPB, BLBPB, where BLBPA is complementary of BLPA and BLBPB is complementary of BLPB. The word line ports disclosed herein are connected to respective word lines. The bit line ports disclosed herein are connected to respective bit lines. The dual-port cell 200 further includes p-channel metal-oxide-semiconductor (PMOS) field-effect transistors PU0, PU1 and n-channel metal-oxide-semiconductor (NMOS) field-effect transistors PG0A, PG0B, PG1A, PG1B, PD0, PD1, where PU stands for pull-up, PG stands for pass-gate, and PD stands for pull-down.

The transistors PU0, PU1 have inverted gate terminals. The transistors PU0, PD0 are connected in series between a voltage supply terminal $V_{DD}$ and a ground reference terminal 202. The transistors PU1, PD1 are connected in series between the voltage supply terminal $V_{DD}$ and the ground reference terminal 202. The gates of PU0, PD0 are connected to each other and to node BB. The gates of PU1, PD1 are connected to each other and to node B. A state of node BB is complementary to a state of node B. Transistors PU0, PU1, PD0, PD1 collectively perform as a latch for storing a bit of data.

Gates of transistors PG0A, PG1A are connected to port WLPA. Gates of transistors PG0B, PG1B are connected to port WLPB. First terminals of pass-gate transistors PG0A, PG0B, PG1A, PG1B are connected respectively to bit line pins BLPA, BLPB, BLBPA, BLBPB. Second terminals of pass-gate transistors PG0A, PG0B are connected to the node B. Second terminals of pass-gate transistors PG1A, PG1B are connected to the node BB.

Worst Case Disturb Failure

A worst case disturb failure can occur when word line WLPA of port A is ON while word line WLPB of port B of a same row is ON. An effective strength of pass-gate transistors (e.g., transistors PG0A, PG0B) is two times stronger when both ports are ON compared to when one port is ON and the other port is OFF. As a result, it becomes harder for a pull-down transistor (e.g., transistor PD0) to fight against the pass-gate transistors and maintain a low node (e.g., node B) in a LOW state. Thus, static noise margin (SNM) is worse and it becomes easier to flip (disturb) a state of the memory cell.

In semiconductor manufacturing, a process corner is an example of a design-of-experiments (DoE) technique that refers to a variation of fabrication parameters used in applying an integrated circuit design to a semiconductor wafer. Process corners represent extremes of fabrication parameter variations within which a circuit that has been etched onto a wafer must function correctly. A circuit may run (e.g., store a bit during a write operation, flip a state of a stored bit during a write operation, or provide a stored bit value during a read operation) slower or faster than specified. In order to verify the robustness of an integrated circuit design, semiconductor manufacturers fabricate corner lots, which are groups of wafers that have had process parameters adjusted to the stated extremes and provide memory arrays having cells with different response times.

A process corner of a SRAM memory array may be referred to as a slow (first speed)/slow (second speed) (SS) corner, a slow/fast (SF) corner, a fast/slow (FS) corner, or a fast/fast (FF) corner, where the first speed refers to the speed of the NMOS transistors of the SRAM memory array and the second speed refers to the PMOS transistors of the SRAM memory array. Whether transistors of a lot are considered slow or fast is based on and relative to factory default reference operating speeds of a default reference memory array manufactured according to predetermined values, thresholds and/or ranges of fabrication parameters. A worst process corner for a SRAM memory array that can result in a disturb failure is the FS process corner (i.e. fast NMOS/slow PMOS). Manufacturing parameters of SRAM cells of a corner lot can be adjusted to target generation of transistors being in a SF (slow NMOS/fast PMOS) corner to eliminate or substantially reduce the risk of disturb failures by substantially increasing SNM. This can be accomplished by: (A) adjusting physical dimensions (e.g., width W and length L) of gates of SRAM cell transistors; or (B) adjusting implant dosages for threshold voltages Vt of SRAM cell transistors while not adjusting physical dimensions of the cell transistors. The threshold voltages refer to the voltages to turn ON the SRAM cell transistors.

The width W and length L of the gates of the SRAM cell transistors may be adjusted prior to manufacturing to: decrease first ratios of W/L for pass-gate and pull-down transistors relative to a default reference ratio of W/L for the pass-gate and pull-down transistors; and increase second ratios of W/L for pull-up transistors relative to a default reference ratio of W/L for the pull-down transistors. The default reference ratios may be preset standardized ratios that result in different types (different first speed/second speed relationships) of process corner lots being produced and a minimal number of SF process corner lots being produced. The adjusted ratios and corresponding ranges may be preselected to assure that a high percentage of process corner lots are SF process corner lots. Process corner lots that do not have W/L ratios within the corresponding ranges of the adjusted ratios may be discarded.

The implant dosages may be adjusted during manufacturing of the SRAM cell transistors at, for example, a foundry. This may include adjusting energy levels of ions provided to transistors during manufacturing to adjust the threshold levels of the SRAM cell transistors. The implant dosages may be adjusted to increase Vt of pass-gate and pull-down transistors and decrease Vt of pull-up transistors relative to default reference threshold voltages for a default reference memory array.

The above-described solution to the worst case disturb failure is dependent on the targeted process corner. The following solutions to the below-described failures can eliminate and/or reduce risk of the corresponding failure independent of the process corner. However, in one embodiment, the SF process corner is targeted while implementing the below-described solutions to provide a comprehensive overall solution.

Also, although targeting the slow NMOS/fast PMOS process corner aids in preventing the disturb failures, targeting the slow NMOS/fast PMOS process corner may worsen margins for normal read and normal write operations. The additional below-described operational methods account for the adjustments used to target the slow NMOS/fast PMOS process corner to effectively improve overall yield and DPPM for SR2P memory.

Worst Case Read Failure

A cell of a dual-port memory is weakest for read operations when both word line ports of the cell are ON and are triggered during a same period to perform a read operation. This is because a pull-down transistor (e.g., PD0 of FIG. 2) needs to discharge bit lines (e.g., BLPA, BLPB of FIG. 2) of both ports. This is especially true for a cell that has a slow NMOS/fast PMOS process corner in which case the cell is further weakened.

To improve a read margin for both ports as well as to compensate for a cell having a slow NMOS/fast PMOS process corner, pulse widths of the word lines during read operations is increased relative to a default reference pulse width. The pulse width of one of the ports may be increased regardless of whether the other port is in an ON state. In an embodiment, the increase in the read pulse width is proportional to a ratio of a default reference cell current to a cell current of the cell having the slow NMOS/fast PMOS process corner.

Worst Case Read/Write Failure

Figure 3:
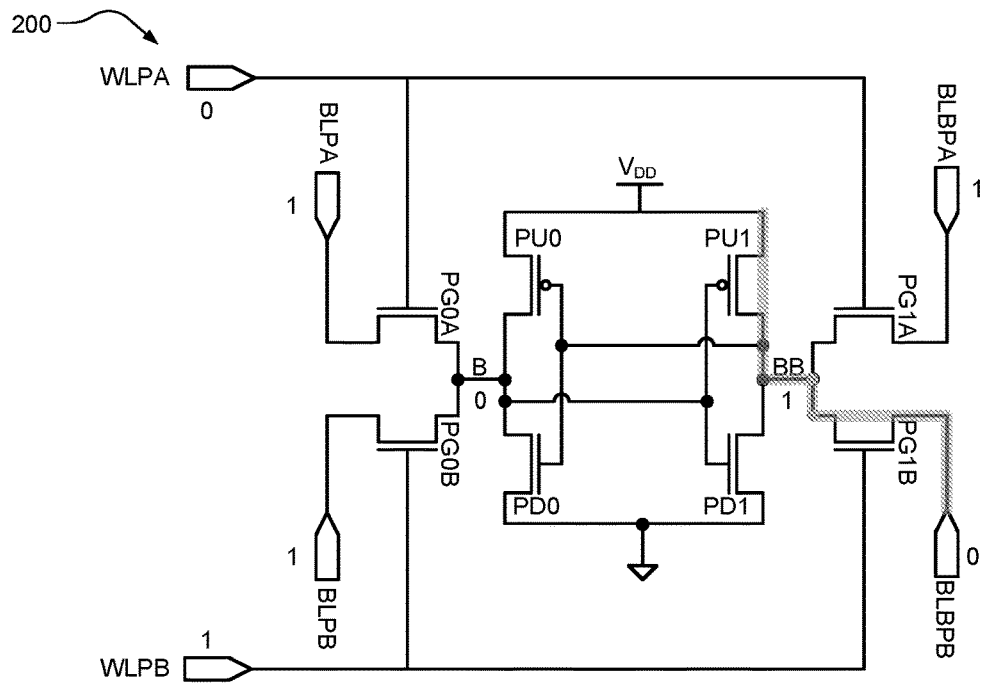
FIG. 3 is a schematic view of an example of the dual-port cell of FIG. 2 illustrating a first concurrent dual access issue.
Figure 4:
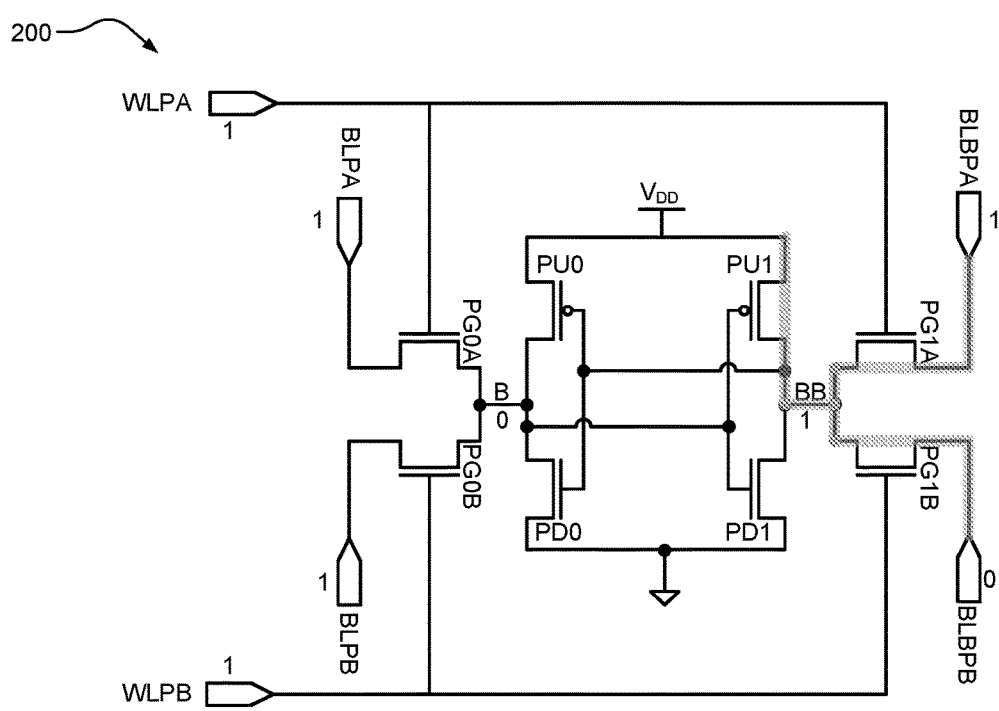
FIG. 4 is a schematic view of an example of the dual-port cell of FIG. 2 illustrating a second concurrent dual access issue.
Figure 5:
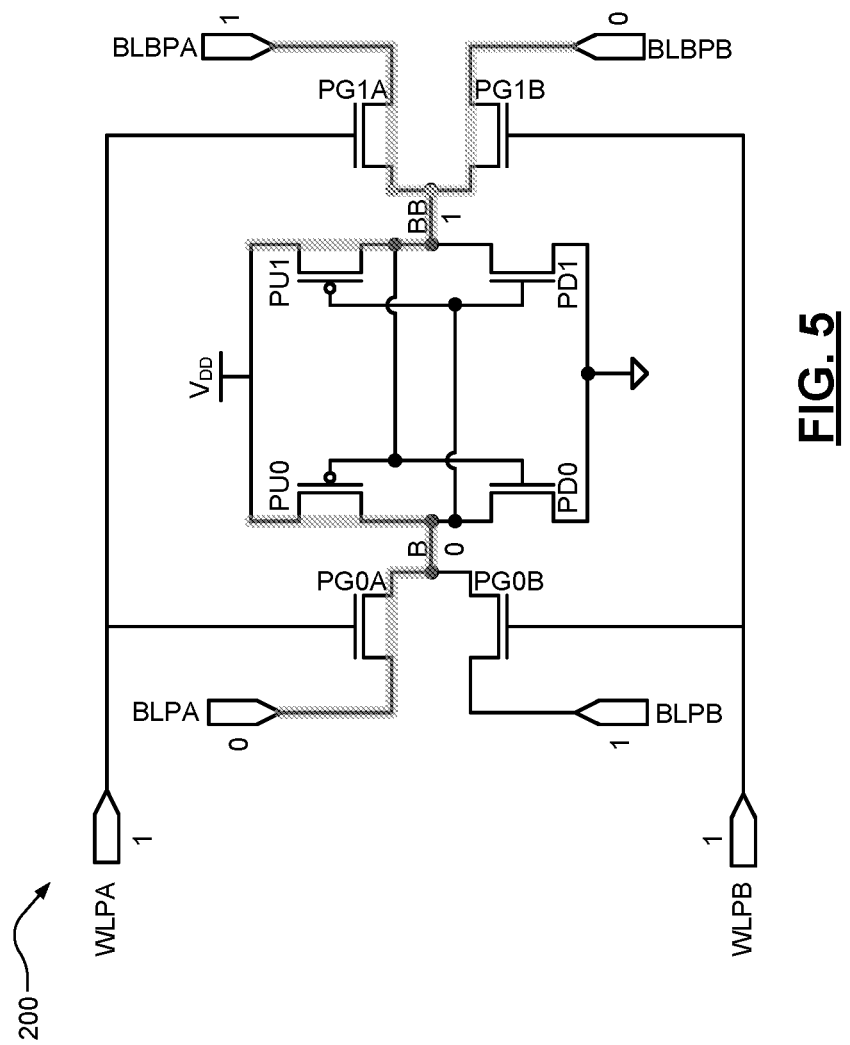
FIG. 5 is a schematic view of an example of the dual-port cell of FIG. 2 illustrating a third concurrent dual access issue.

During a write operation of a first port of a first cell, if a second port of the first cell or another cell of a same row as the first cell is performing a read operation, then the write operation becomes more difficult to accomplish without a failure. A worst scenario for concurrent read/write operations happens if: a corresponding read word line pulse is wider than a corresponding write word line pulse; the read word line is turned ON prior to the write word line; and the write word line turns OFF at a same time or prior to the read word line. In this scenario, during an entire ON period of the write word line, a writing path of a cell may contend with one or more of three opposing actions. As a first example, port A is OFF and port B is ON and the first pass-gate transistor PG1B of FIGS. 3-5 is turned ON to perform a write and "fights" against the first pull-up transistor PU1 (referred to as the first opposing action). The first pass-gate transistor PG1B is writing a '0' to node BB. The first pass-gate transistor fights against the first pull-up transistor because the first pass-gate transistor is in a different state (e.g., a pre-charged state of 1) than the first pull-up transistor (e.g., the first pull-up transistor may have a state of 0). As node BB goes to 0, node B is pulled up to 1 by PU0. See FIG. 3 which shows the dual-port cell 200 and a highlighted path for the fighting between PG1B and PU1 as node BB is being discharged through PG1B.

As a second example and in addition to the first example, both ports A, B are turned ON and bit line pin BLPA did not have time to be pulled LOW (i.e. to '0') by the cell. The first pass-gate transistor PG1B of the first port performing the write operation fights against the first pass-gate transistor PG1A of the second port (referred to as the second opposing action) in addition to fighting against the pull-up transistor PU1. See FIG. 4 which shows the dual-port cell 200 and highlighted paths of current being discharged from the transistors PU1, PG1A to the transistor PG1B. FIG. 4 is applicable to a MUX 2 example of a dual-port memory, where operation is performed to a cell in row 0, column 0 while a read operation is performed to a cell at row 0, column 1. FIG. 4 shows what may occur for this example, where the dual-port cell 200 is the cell in row 0, column 0. Port A is ON although the read operation is being performed in the cell of row 0, column 1.

As a third example and in addition to the first and second examples, both ports are turned ON and the pin BLPA had enough time to be pulled LOW by the cell. The second pull-up transistor PU0 fights against the second pass-gate transistor PG0A (referred to as the third opposing action) in addition to the first pass-gate transistor PG1B fighting against the second pass-gate transistor PG1A and the pull-up transistor PU1.

State values of '1' and '0' are shown for pins WLPA, WLPB, BLPA, BLPB, BLBPA, BLBPB, and nodes B, BB in FIGS. 3-5, which correspond to the three fighting conditions described. A write operation is more difficult to accomplish for the second example of FIG. 4 than the first example of FIG. 3. A write operation is more difficult to accomplish for the third example of FIG. 5 than the second example of FIG. 4. See FIG. 5 which shows the dual-port cell 200 and WLPA performing the read operation turns ON before WLPB performing the write operation turns ON. When WLPA turns on PG0A and PG1A, BLPA is pulled down by PG0A. As WLPB turns on PG0B and PG1B to perform write operation to pull down node BB and to pull p node B, additional fighting path between PU0 and PG0A is generated.

When only one port is ON, the writing path contends with one opposing action, as described by the first example and shown in FIG. 3. When both ports are ON and the word line performing the read operation turns ON no earlier than the word line performing the write operation, the writing path contends with two opposing actions, as described by the second example and shown in FIG. 4. When both ports are ON and the word line performing the read operation turns ON before the word line performing the write operation turns ON, the writing path contends with three opposing actions, as described by the third example and shown in FIG. 5.

To eliminate or substantially reduce dual-port read/write interaction, a pulse width of the word line performing the write operation is increased to be longer than a pulse width of the word line signal performing the read operation. The pulse width of the word line performing the write operation may be longer than the pulse width of the word line performing the read operation by a predetermined margin. Essentially, the aggressor (or read pulse) is turned OFF prior to the write pulse; such that there is sufficient effective write time left over after the read pulse, allowing the cell to perform a single write port access for a period of time. This assures that a correct value is written in the cell subsequent to the read operation being completed.

Figure 6:
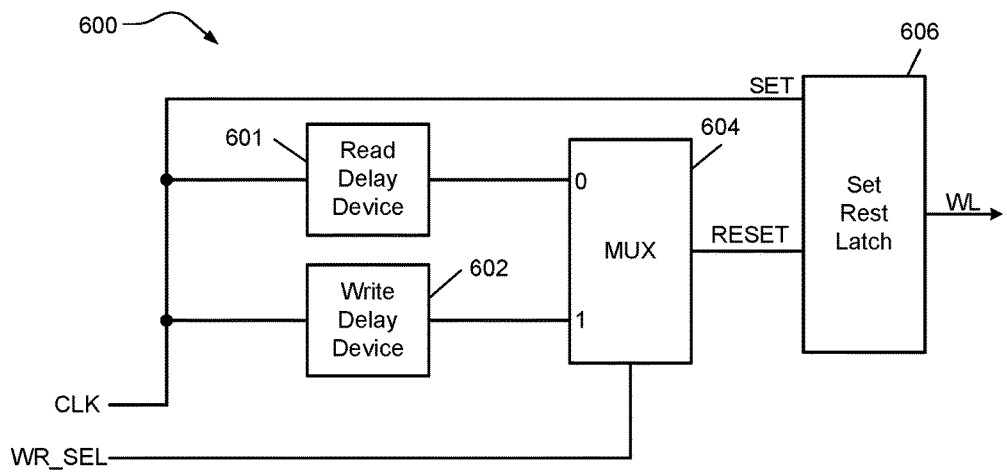
FIG. 6 is a functional block diagram of an example of a traditional word line pulse generator.

In conventional SR2P memory, a read pulse width is determined based on a read timing path and a write pulse width is determined based on a write timing path and these two paths are independent of each other. A traditional pulse width generator 600 is shown in FIG. 6 and includes a read delay device 601, a write delay device 602, a multiplexer 604 and a set reset latch 606. As an example, the delay devices 601, 602 may be implemented as buffers. The read delay device 601 and the write delay device 602 are connected in parallel and receive a clock signal CLK. Outputs of the delay devices 601, 602 are provided to the multiplexer 604. The multiplexer 604 selects one of the outputs based on a write selection signal WR_SEL. An output signal of the multiplexer 604 is provided along with the clock signal CLK respectively to RESET and SET inputs of the set reset latch 606, which generates a word line signal. The word line signal is provided to a word line port of a cell of a dual-port memory.

Figure 7:
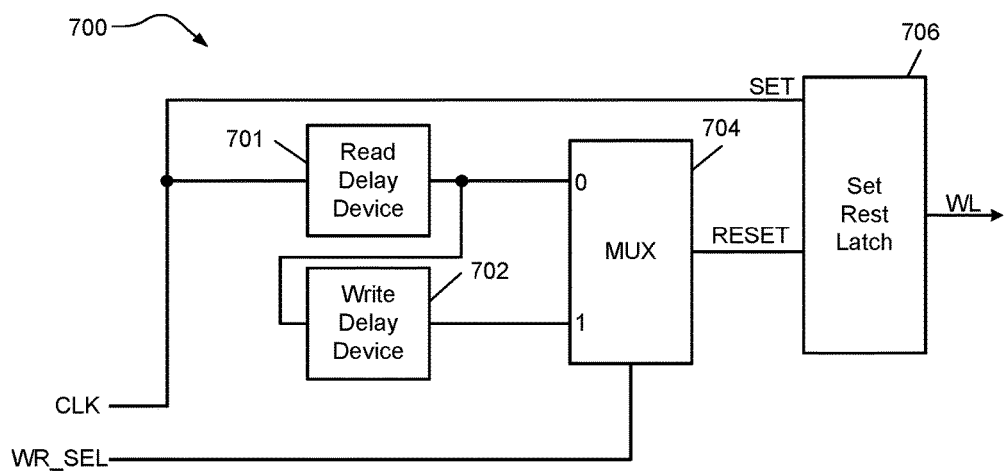
FIG. 7 is a functional block diagram of an example of a word line pulse generator in accordance with an embodiment of the present disclosure.

FIG. 7 shows an example of a word line pulse generator 700 as disclosed herein. The word line pulse generator 700 includes a read delay device 701, a write delay device 702, a multiplexer 704 and a set reset latch 706. The read delay device 701 and write delay device 702 are not connected in parallel. As an example, the delay devices 601, 602 may be implemented as buffers. The read delay device 701 receives the clock signal CLK. The write delay device 702 received the clock signal CLK from the read delay device 701. Outputs of the delay devices 701, 702 are provided to the multiplexer 704. The multiplexer 704 selects one of the outputs based on the write selection signal WR_SEL. An output signal of the multiplexer 704 is provided along with the clock signal CLK respectively to RESET and SET inputs of the set reset latch 706, which generates a word line signal. The word line signal is provided to a word line port of a cell of a dual-port memory.

Delay of the write timing path, which includes the delay devices 701, 702, is equal to a sum of the delays of the delay devices 701, 702. This causes the delay of when the output of the multiplexer 704 is to be received at the RESET input of the set reset latch 706 for the word line performing the write operation to be longer than the delay of when the output of the multiplexer 704 is to be received at the RESET input for the word line performing the read operation. Thus, the duration of the delay of a write pulse is dependent on the duration of the delay of a read pulse. As a result, the write pulse is guaranteed to be wider than the read pulse in any process voltage temperature (PVT) condition. This causes the width of the pulse of the word line performing the write operation to be longer than the width of the pulse of the word line performing the read operation. Thus, the duration of the write pulse is dependent on the duration of the read pulse.

Worst Case Write/Write Failure

If both ports of a dual-port cell are performing a write operation, then the above solution of FIG. 7 is not applicable since the word lines of both of the ports have a same pulse width. The worst case scenario for concurrent write/write operation and the resulting difficulties are the same as those described above for worst case scenario for read/write operation. The above-stated three opposing actions of the above-described three examples exist. These actions are overcome by the below-described embodiments, which eliminate or substantially reduce write/write interactions.

In a first embodiment, memory behavior is restricted by not permitting a write operation in a second port of a cell while a write operation of a first port of the cell is performed. This may be prevented by, for example, the dual-port memory access module 112 and/or the control module 114 of FIG. 1. Preventing concurrent writes to two ports prevents the second and third opposing actions from occurring. The restricted memory behavior has minimal effect on operation of the SR2P memory since many applications: use SR2P memory as first-in-first-out (FIFO) memory; do not typically perform concurrent write/write operations to a same cell and/or cells of a same row; and may be prevented from performing write/write operations to cells of a same column. If the memory behavior is restricted as described, then the below described embodiments of FIGS. 9-10 may not be implemented. If the memory behavior is not restricted as described, then the below described embodiments of FIGS. 9-10 may be implemented.

Figure 8:
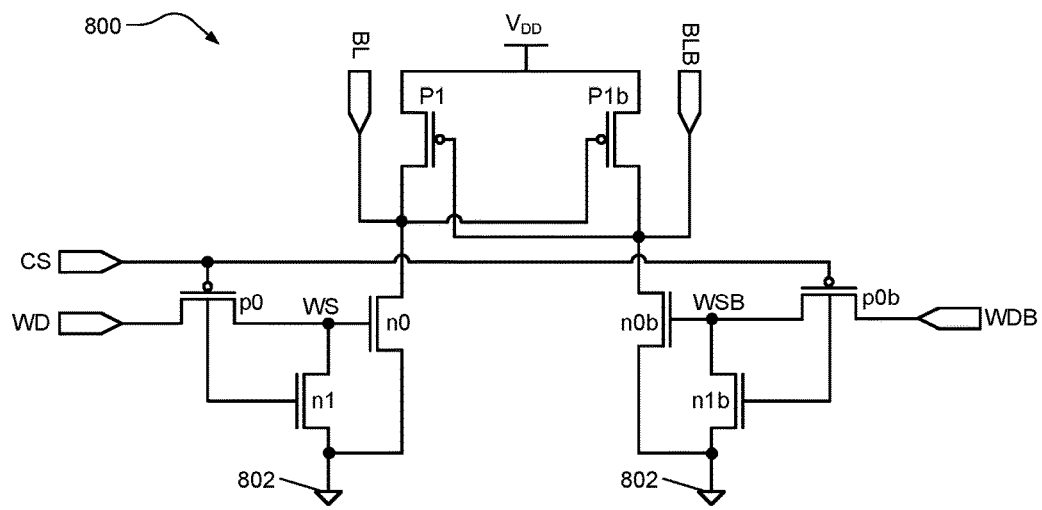
FIG. 8 is a schematic view of an example of a traditional Mux (or input/output (I/O)) circuit.

FIG. 8 shows a traditional Mux (or I/O) circuit 800 for a cell of a dual-port memory. Each port of a cell of a dual-port memory may have a corresponding Mux circuit similar to the Mux circuit 800. The Mux circuit 800 is a cross-coupled PMOS write circuit and includes transistors P1, P1b, p0, p0b including inverted gates and transistors n0, n0b, n1, n1b having non-inverting gates. The transistors P1 and n0 are connected in series between voltage reference terminal $V_{DD}$ and ground reference terminal 802. The transistors P1b and n0b are connected in series between voltage reference terminal $V_{DD}$ and ground reference terminal 802. The gates of the transistors P1 and P1b are connected to respectively to bit lines BLB, BL. The bit line BLB is connected to drains of transistors P1b, n0b. The bit line BL is connected to drains of transistors P1, n0. The transistor p0 is connected between a write data pin WD and a gate of transistor n0. The transistor p0b is connected between a gate of transistor n0b and write data pin WDB. States of WD and WDB are the data to be written when in the write mode. Gates of the transistors p0, p0b, n1, n1b are connected to a column select pin CS. The transistor n1 is connected between the gate of the transistor n0 and the ground reference terminal 802. The transistor n1b is connected between the gate of the transistor n0b and the ground reference terminal 802.

Figure 9:
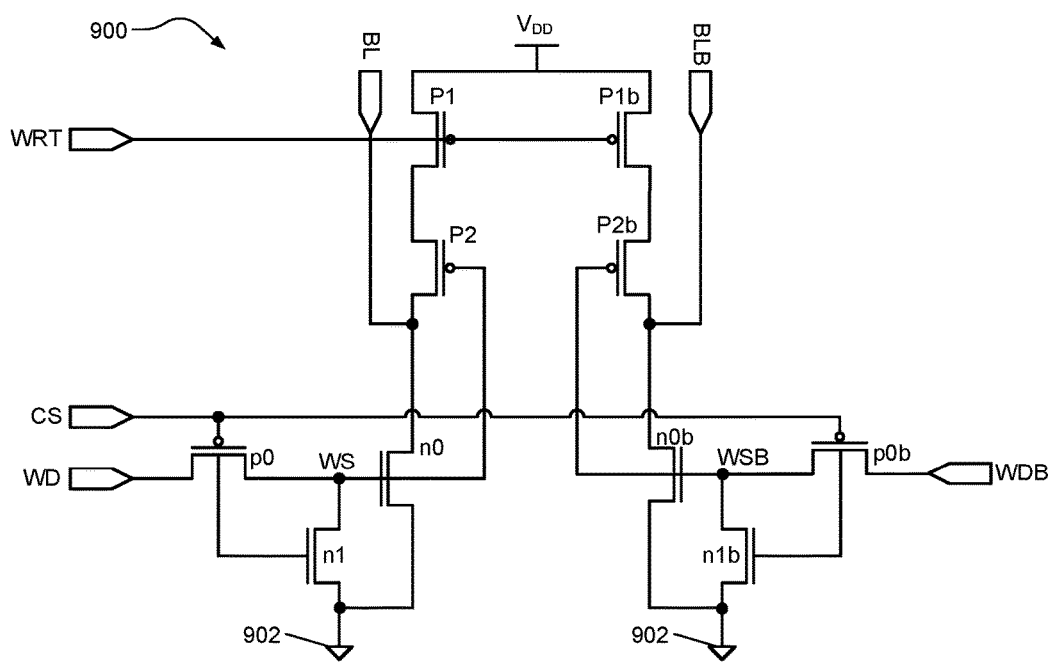
FIG. 9 is a schematic view of a simplified example of a Mux (or I/O circuit) including stacked transistors in accordance with an embodiment of the present disclosure.

FIG. 9 shows a Mux (or I/O) circuit 900 for a cell of a dual-port memory as disclosed herein. Each port of a cell of a dual-port memory may have a corresponding Mux circuit configured as the Mux circuit 900. The Mux circuit 900 is a stacked PMOS write circuit and includes transistors P1, P1b, P2, P2b, p0, p0b including inverted gates and transistors n0, n0b, n1, n1b having non-inverting gates. The transistors P1, P2 and n0 are connected in series between voltage reference terminal $V_{DD}$ and ground reference terminal 902. The transistor P1 is connected in series between the transistor P2 and the transistor n0. The transistors P1b, P2b and n0b are connected in series between voltage reference terminal $V_{DD}$ and ground reference terminal 902. The transistor P1b is connected in series between the transistor p2b and the transistor n0b. The gates of transistors p1, p1b are connected to a write mode pin WRT, which is a '0' when operating in a write ode and is a '1' when operating in a read mode.

The gates of the transistors P2 and P2b are connected respectively to a first node WS between transistors p0, n0, n1 and a second node WSB connected between transistors n0b, p0b, n1b. The first node WS is connected to a gate of transistor n0 and drains of transistors p0, n1. The second node WSB is connected to a gate of transistor n0b and drains of transistors p0b, n1b. The bit line BLB is connected to drains of transistors P2b, n0b. The bit line BL is connected to drains of transistors P2, n0.

The transistor p0 is connected between a write data pin WD and a gate of transistor n0. The transistor p0b is connected between a gate of transistor n0b and write data pin WDB. Gates of the transistors p0, p0b, n1, n1b are connected to a column select pin CS. The transistor n1 is connected between the gate of the transistor n0 and the ground reference terminal 902. The transistor n1b is connected between the gate of the transistor n0b and the ground reference terminal 902.

The stacked PMOS write circuit of FIG. 9 eliminates the effect of the above-described third opposing action. For example, during a concurrent write/write operation, data is written to a first cell column 1 via port A of the first cell and to a second cell in column 0 via port B of the second cell, where the first cell and the second cell are in the same row. The source of the problem for the third opposing action comes from the fact that port A of the second cell, which is not being written to permitting bit line for BLPA to be pulled LOW when word line for WLPA turns ON, as shown in FIG. 5. If word line for WLPA turns ON early enough, bit line for BLPA may be pulled all the way down to a ground potential. This results in the intended write function of flipping the BB node from '1' to '0' and the B node from '0' to '1' being more difficult when the word line for WLPB turns ON later than the word line for WLPA. This is because the pull-up transistor PU0 now needs to supply charge to pull up bit line for BLPA through the pass-gate transistor PG0A. The stacked PMOS write circuit of FIG. 9 solves this problem by preventing the bit line BLPA or any bit line not being explicitly written to from being pulled LOW by the corresponding cell.

Figure 10:
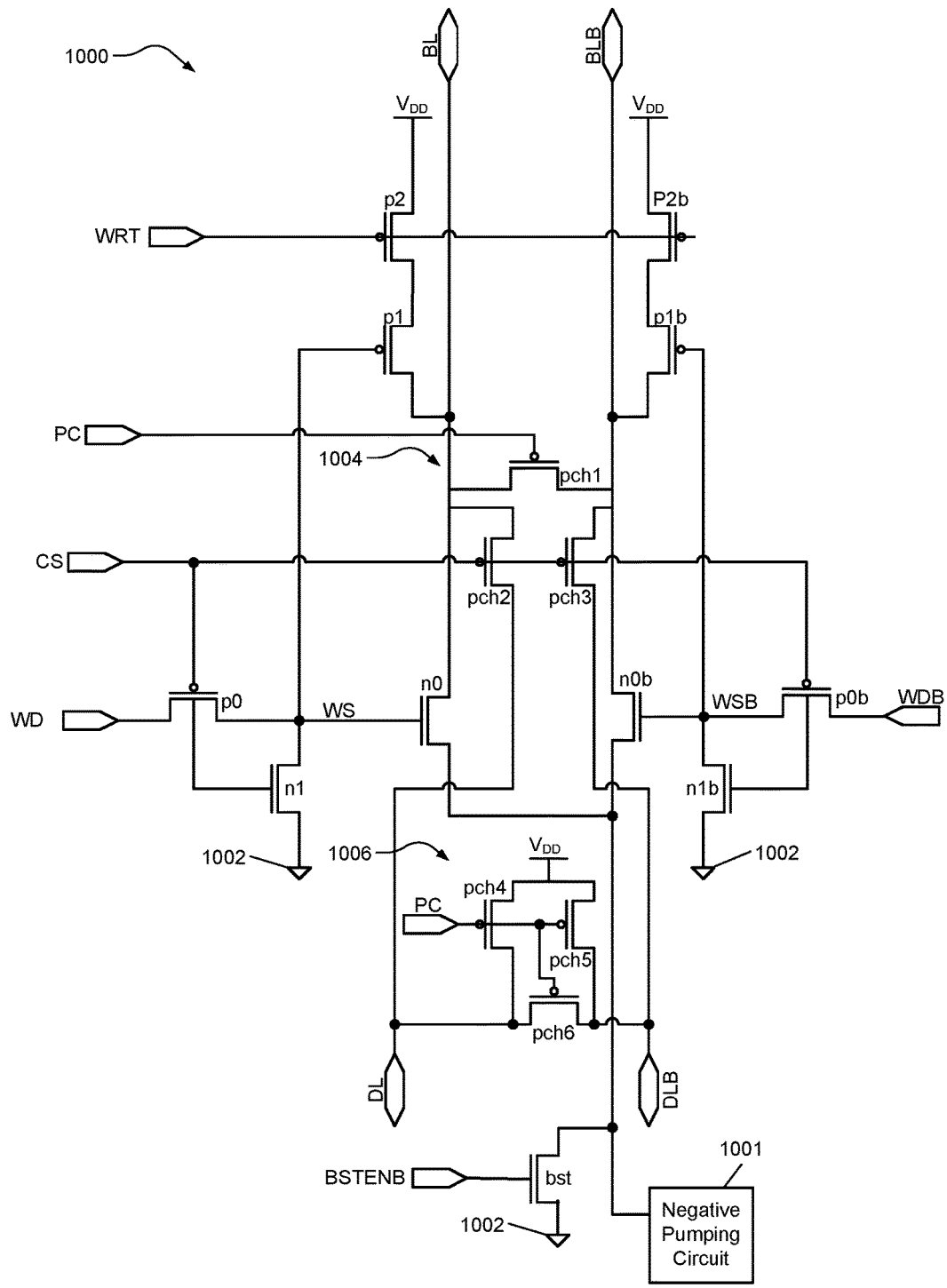
FIG. 10 is a schematic view of an example of a Mux (or I/O circuit) including stacked transistors and a negative pumping circuit in accordance with an embodiment of the present disclosure.

For simplicity, read, pre-charge and column multiplexer circuits are not shown in FIGS. 8-9, but may be included. Example pre-charge circuits are shown in FIG. 10. In FIG. 9, when WRT is '0' and there is either no explicit write command (i.e. the column select pin CS is '1' such that write data select nodes WS, WSB are '0') or data masking is asserted (i.e. CS is '0' and write data pins WD, WDB are '0'), the column bit lines BL, BLB are maintained in a HIGH (or '1') state. This is because transistors p2, p2b, p1, p1b are ON and transistors n0, n0*b*, p0, p0*b*, n1, n1*b* are OFF and the bit lines for BL, BLB are connected to the voltage reference terminal $V_{DD}$.

If the port corresponding to the Mux circuit 900 of FIG. 9 is operating in a read mode, then WRT is a '1' and the pull up circuit (i.e. one of the pull-up transistors of the port of the corresponding cell) is disabled and does not interfere with a read function of the cell. In this case, the write function relies on the corresponding word line write pulse being wider than the width of the read pulse.

The embodiment of FIG. 9 solves the third opposing action associated with the transistor PU0 (or left side problem) of FIG. 5. If port A is turned ON prior to port B, instead of the bit line for BLPA going LOW and the third opposing action occurring as when the Mux circuit 800 of FIG. 8 is used, the Mux circuit 900 of FIG. 9 forces bit line for BLPA HIGH and does not allow bit line for BLPA to go LOW. This prevents the third opposing action from occurring.

Referring to FIG. 9, during the read mode, when WRT is HIGH, WS and WSB are LOW, and CS is HIGH. During a write mode, when WRT is LOW, WS and WSB may be HIGH or LOW, and CS is LOW. As a MUX 2 example, operation of a first cell of column 0 and a second cell of column 1 are described, where the first cell and the second cell are in the same row. The Mux circuit 900 forces pre-charging of the bit lines for BL, BLB of FIG. 9 and BLPA, BLBPA of FIG. 5 to HIGH when CS is LOW for the one of the cells of an unselected column. For the column not being read from, CS is HIGH, WS and WSB are LOW; P1 and P1*b* are ON, which results in the bit lines for BL, BLB being forced HIGH.

FIG. 10 shows a Mux (or I/O) circuit 1000 including stacked transistors and a negative pumping circuit. Each port of a cell of a dual-port memory may have a corresponding Mux circuit configured as the Mux circuit 1000. The Mux circuit 1000 is a stacked PMOS write circuit with negative pumping and pre-charge circuits included. The Mux circuit 1000 includes transistors P1, P1*b*, P2, P2*b*, p0, p0*b* including inverted gates and transistors n0, n0*b*, n1, n1*b* having non-inverting gates. The transistors P1, P2 and n0 are connected in series between voltage reference terminal $V_{DD}$ and a negative pumping circuit 1001. The transistor P1 is connected in series between the transistor P2 and the transistor n0. The transistors P1*b*, P2*b* and n0*b* are connected in series between voltage reference terminal $V_{DD}$ and the negative pumping circuit 1001. The transistor P1*b* is connected in series between the transistor p2*b* and the transistor n0*b*. The gates of transistors p2, p2*b* are connected to a write mode pin WRT, which is a '0' when operating in a write mode and is a '1' when operating in a read mode.

The gates of the transistors P1 and P1*b* are connected respectively to a first node WS between transistors p0, n0, n1 and a second node WSB connected between transistors n0*b*, p0*b*, n1*b*. The first node WS is connected to a gate of transistor n0 and drains of transistors p0, n1. The second node WSB is connected to a gate of transistor n0*b* and drains of transistors p0*b*, n1*b*. The bit line pin BLB is connected to drains of transistors P1*b*, n0*b*. The bit line pin BL is connected to drains of transistors P1, n0.

The transistor p0 is connected between a write data pin WD and a gate of transistor n0. The transistor p0*b* is connected between a gate of transistor n0*b* and write data pin WDB. Gates of the transistors p0, p0*b*, n1, n1*b* are connected to a column select pin CS. The transistor n1 is connected between the gate of the transistor n0 and the ground reference terminal 1002. The transistor n1*b* is connected between the gate of the transistor n0*b* and the ground reference terminal 1002.

Pre-charging circuits 1004, 1006 are provided by transistors pch1, pch2, pch3, pch4, pch5, pch6. Gates of the transistors pch1, pch2, pch3, pch4, pch5, pch6 have inverting inputs. Gates of transistors pch1, pch4, pch5, pch6 are connected to a pre-charge circuit pin PC, which receives a pre-charge signal from the control module 114. The transistor pch1 is connected across the bit lines pins BL, BLB. The transistor pch2 is connected between the bit line pin BL and pin DL. The transistor pch3 is connected between the bit line pin BLB and pin DLB. Gates of transistors pch2, pch3 are connected to the column select pin CS. Sources of the transistors pch 4, pch5 are connected to the voltage reference terminal $V_{DD}$. The drains of the transistors pch4, pch5 are connected to respective terminals of the transistor pch6 and pins DL, DLB.

The negative pumping circuit 1001 is connected to sources of the transistors n0, n0*b*. A boost enable transistor bst is connected between (i) the ground reference terminal 1002 and (ii) the sources of the transistors n0, n0*b* and to the negative pumping circuit. The boost enable transistor bst is turned off before operation of the negative pumping circuit 1001. A gate of the boost enable transistor bst receives an enable signal via a pin BSTENB. The negative pumping circuit 1001 includes NMOS and PMOS transistors and one or more transistors connected as a capacitor. The negative pumping circuit 1001 is connected to the control module 114 and is configured to allow voltages of the bit lines to be negative (or drop below 0V). This makes a write operation easier by providing a higher $V_{GS}$ (gate-source voltage) on a pass-gate transistor (e.g., the pass-gate transistor PG1B of FIG. 5) of a cell, which increases strength of the cell.

Traditionally, a negative pumping circuit is used to overcome a low $V_{DD}$. As described above, the negative pumping circuit 1001 operates independent of $V_{DD}$ and is used to overcome the first and second opposing action issues. The negative pumping circuit 1001 is used for write assistance and substantially reduces the effect of the second opposing action. The negative pumping circuit 1001 pulls voltage of the bit line BL below the potential of the ground reference terminal 1002 to make pass-gate transistor PG1B of FIG. 5 effectively stronger. This helps PG1B to pull down node BB. The negative pumping circuit 1001 used in combination with other above-described embodiments provides a complete solution for improved SR2P memory yield and decreased DPPM.

The wireless communications described in the present disclosure can be conducted in full or partial compliance with IEEE standard 802.11-2016, IEEE standard 802.16-2009, IEEE standard 802.20-2008 and/or Bluetooth Core Specification v4.0. In various implementations, Bluetooth Core Specification v4.0 may be modified by one or more of Bluetooth Core Specification Addendums 2, 3, or 4. In various implementations, IEEE 802.11-2016 may be supplemented by draft IEEE standard 802.11ah-2016 and/or draft IEEE standard 802.11ai-2016.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

In this application, apparatus elements described as having particular attributes or performing particular operations are specifically configured to have those particular attributes and perform those particular operations. Specifically, a description of an element to perform an action means that the element is configured to perform the action. The configuration of an element may include programming of the element, such as by encoding instructions on a non-transitory, tangible computer-readable medium associated with the element.

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A dual-port memory comprising:
   a first memory array comprising a plurality of memory cells, wherein the first memory array comprises two ports for each cell of the plurality of memory cells; and
   at least one address decoder to generate a plurality of word line signals for concurrent access to the two ports of one or more memory cells of the plurality of memory cells in a same row of the first memory array, wherein each of the word line signals is generated to perform a read operation, and wherein pulse widths of the word line signals for the read operations are proportional to a ratio of (i) a reference amount of cell current of a cell of a reference memory array to (ii) an amount of cell current of the one or more memory cells of the plurality of memory cells in the same row of the first memory array.

2. The dual-port memory of claim 1, wherein the plurality of memory cells have a slow n-channel metal-oxide-semiconductor/fast p-channel metal-oxide-semiconductor process corner.

3. The dual-port memory of claim 2, wherein cells of the reference memory array have a default process corner different than the process corner of the one or more memory cells.

4. The dual-port memory of claim 1, wherein the pulse widths of the plurality of word line signals are longer than pulse widths of word line signals generated for read operations of cells of the reference memory array.

5. The dual-port memory of claim 1, wherein the one or more memory cells include only a single memory cell.

6. The dual-port memory of claim 1, wherein the one or more memory cells include two memory cells.

7. The dual-port memory of claim 1, wherein:
   width to length ratios of gates of pass-gate transistors and pull-down transistors of the one or more memory cells are smaller than corresponding ones of width to length ratios of gates of pass-gate transistors and pull-down transistors of cells of the reference memory array; and
   width to length ratios of gates of pull-up transistors of the one or more memory cells are smaller than corresponding ones of width to length ratios of gates of pull-up transistors of the cells of the reference memory array.

8. The dual-port memory of claim 1, wherein:
   threshold voltages of pass-gate transistors and pull-down transistors of the one or more memory cells are greater than corresponding ones of threshold voltages of pass-gate transistors and pull-down transistors of cells of the reference memory array; and
   threshold voltages of pull-up transistors of the one or more memory cells are less than corresponding ones of threshold voltages of pull-up transistors of the cells of the reference memory array.

9. The dual-port memory of claim 1, wherein the two ports of each of the plurality of memory cells are input ports of the respective one of the plurality of memory cells.

10. A word line pulse generator circuit for a dual-port memory, the word line pulse generator circuit comprising:
    a read delay device to receive a clock signal;
    a write delay device to receive an output of the read delay device;
    a multiplexer to (i) receive a write select signal, and (ii) based on the write select signal, select an output of the read delay device or an output of the write delay device; and
    a set reset latch to (i) receive the clock signal and an output of the multiplexer, and (ii) generate a word line signal for the dual-port memory.

11. The word line pulse generator circuit of claim 10, wherein duration of a pulse width of the word line signal for a write operation is longer than a duration of a pulse width of the word line signal for a read operation.

12. The word line pulse generator circuit of claim 11, wherein the duration of the pulse width of the word line signal for the write operation is equal to the duration of the pulse width of the word line signal for the read operation plus a predetermined delay.

13. A dual-port memory comprising:
    a first address decoder comprising the word line pulse generator circuit of claim 10;
    a memory array comprising a plurality of cells, wherein a first port of a first cell of the plurality of cells is to receive the word line signal from the set reset latch; and
    an input/output circuit to read from or write to the first cell.

14. The dual-port memory of claim 13, further comprising a second word line pulse generator circuit, wherein:
    the second word line pulse generator circuit is to generate a second word line signal, and
    a second port of the first cell or a port of a second cell of the plurality of cells is to receive the second word line signal.

15. The dual-port memory of claim 13, wherein the plurality of cells have a slow n-channel metal-oxide-semiconductor/fast p-channel metal-oxide-semiconductor process corner.

16. A dual-port memory comprising:
    a first memory array comprising a plurality of cells, wherein the plurality of cells comprise a first cell and a second cell, and wherein the first cell and the second cell are in a same row of the memory array;
    at least one address decoder to generate (i) a first word line signal to access a first port of the first cell, and (ii) a second word line signal to access a second port of the first cell or a port of the second cell; and
    a control circuit to permit the at least one address decoder to concurrently access the first port of the first cell and either the second port of the first cell or the port of the second cell while preventing the at least one address decoder from writing to the first port of the first cell while writing to either the second port of the first cell or the port of the second cell.

17. The dual-port memory of claim 16, wherein the plurality of cells have a slow n-channel metal-oxide-semiconductor/fast p-channel metal-oxide-semiconductor process corner.

18. The dual-port memory of claim 16, wherein:
    the first word line signal and the second word line signal are generated to perform respective read operations; and a read pulse width of the first word line signal and a read pulse width for the second word line signal are directly proportional to a ratio of (i) a reference amount of cell current for a cell of a reference memory array to (ii) an amount of cell current for the first cell and the second cell.

19. The dual-port memory of claim 16, wherein:
the at least one address decoder comprises a word line pulse generator circuit; and
the word line pulse generator circuit is configured to generate the first word line signal and comprises
 a read delay device to receive a clock signal,
 a write delay device to receive an output of the read delay device,
 a multiplexer to (i) receive a write select signal, and (ii) based on the write select signal, select an output of the read delay device or an output of the write delay device, and
 a set reset latch to (i) receive the clock signal and an output of the multiplexer, and (ii) generate a word line signal for the dual-port memory.

20. A Mux circuit for a dual-port memory, the Mux circuit comprising:
a first transistor connected to a first bit line of a first cell of the dual-port memory;
a second transistor stacked on the first transistor and connected to a voltage supply reference terminal, wherein the second transistor is to receive a write signal;
a third transistor to receive a column select signal and a data signal, wherein the data signal include a bit to be written to the first cell of the dual-port memory; and
a first plurality of transistors connected to the first transistor and the third transistor,
wherein
 when the column select signal is deactivated, the first transistor and the second transistor are activated to pre-charge the first bit line, and
 during a write operation, the write signal activates the second transistor and the column select signal activates the third transistor to write the bit to the first cell via the first bit line.

21. The Mux circuit of claim 20, further comprising:
a fourth transistor connected to a second bit line of the first cell;
a fifth transistor stacked on the fourth transistor and connected to the voltage supply reference terminal, wherein the fifth transistor is to receive the write signal;
a sixth transistor to receive the column select signal and a complement of the data signal; and
a second plurality of transistors connected to the fourth transistor and the fifth transistor,
wherein
 when the column select signal is deactivated, the fourth transistor and the fifth transistor are activated to pre-charge the second bit line, and
 during the write operation, the write signal activates the fifth transistor and the column select signal activates the sixth transistor.

22. The Mux circuit of claim 20, wherein:
the first transistor and the second transistor are p-channel metal-oxide-semiconductor transistors; and
the third transistor and the first plurality of transistors are n-channel metal-oxide-semiconductor transistors.

23. The Mux circuit of claim 20, wherein during the write operation, the write signal is in a LOW state and the column select signal is in a LOW state.

24. The Mux circuit of claim 20, wherein, during a read operation of the first cell, the write signal deactivates the second transistor and the column select signal is deactivates the third transistor.

25. The Mux circuit of claim 20, further comprising a negative pumping circuit to, during the write operation and independent of a voltage of the voltage supply reference terminal, pulls the first bit line down to a negative voltage.

26. A dual-port memory system comprising:
the Mux circuit of claim 20 to perform the write operation to a first port of the first cell; and
a second Mux circuit to, during the write operation to the first port of the first cell, perform a second write operation to a second port of the first cell or a port of a second cell, wherein the first cell and the second cell are in a same row of the dual-port memory.

27. A dual-port memory system comprising:
the Mux circuit of claim 20; and
the dual-port memory comprising a plurality of cells, wherein the plurality of cells have a slow n-channel metal-oxide-semiconductor/fast p-channel metal-oxide-semiconductor process corner.

28. The dual-port memory system of claim 27, further comprising at least one address decoder, wherein:
the plurality of cells comprise a first cell and a second cell, and wherein the first cell and the second cell are in a same row of the dual-port memory; and
the at least one address decoder to generate (i) a first word line signal to access a first port of the first cell, and (ii) a second word line signal to access a second port of the first cell or a port of the second cell while the first port of the first cell is accessed.

29. The dual-port memory system of claim 28, wherein:
the first word line signal and the second word line signal are generated to perform respective read operations; and
a read pulse width of the first word line signal and a read pulse width for the second word line signal are directly proportional to a ratio of (i) a reference amount of cell current for a cell of a reference memory array to (ii) an amount of cell current for the first cell and the second cell.

30. The dual-port memory system of claim 28, wherein:
the at least one address decoder comprises a word line pulse generator circuit; and
the word line pulse generator circuit is configured to generate the first word line signal and comprises
 a read delay device to receive a clock signal,
 a write delay device to receive an output of the read delay device,
 a multiplexer to (i) receive a write select signal, and (ii) based on the write select signal, select an output of the read delay device or an output of the write delay device, and
 a set reset latch to (i) receive the clock signal and an output of the multiplexer, and (ii) generate a word line signal for the dual-port memory.

* * * * *